United States Patent
Chang

(10) Patent No.: US 11,757,420 B2
(45) Date of Patent: Sep. 12, 2023

(54) METHOD FOR DYNAMICALLY ADJUSTING ADJUSTABLE GAIN VALUE TO EQUALIZE INPUT SIGNAL TO GENERATE EQUALIZER OUTPUT SIGNAL AND ASSOCIATED LEVELING EQUALIZER

(71) Applicant: Elite Semiconductor Microelectronics Technology Inc., Hsinchu (TW)

(72) Inventor: Jung-Kuei Chang, Hsinchu (TW)

(73) Assignee: Elite Semiconductor Microelectronics Technology Inc., Hsinchu (TW)

( * ) Notice: Subject to any disclaimer, the term of this patent is extended or adjusted under 35 U.S.C. 154(b) by 99 days.

(21) Appl. No.: 17/324,135

(22) Filed: May 19, 2021

(65) Prior Publication Data

US 2022/0376667 A1    Nov. 24, 2022

(51) Int. Cl.
| | |
|---|---|
| *H03G 5/16* | (2006.01) |
| *H03G 9/02* | (2006.01) |
| *H03G 5/00* | (2006.01) |
| *H03G 3/32* | (2006.01) |

(52) U.S. Cl.
CPC ............... *H03G 5/165* (2013.01); *H03G 3/32* (2013.01); *H03G 5/005* (2013.01); *H03G 9/025* (2013.01)

(58) Field of Classification Search
CPC .......... H03G 5/005; H03G 5/165; H03G 3/32; H03G 9/025
See application file for complete search history.

(56) References Cited

U.S. PATENT DOCUMENTS

| | | | | |
|---|---|---|---|---|
| 4,185,325 A | * | 1/1980 | Appel | H03H 17/04 708/320 |
| 4,872,184 A | | 10/1989 | Yamaguchi | |
| 5,172,358 A | * | 12/1992 | Kimura | H03G 5/005 381/108 |
| 5,714,918 A | * | 2/1998 | Menkhoff | H03H 17/0266 381/98 |
| 6,819,166 B1 | | 11/2004 | Choi | |
| 7,016,509 B1 | * | 3/2006 | Bharitkar | H03G 5/22 381/103 |

(Continued)

OTHER PUBLICATIONS

Regalia et al., "The Digital All-Pass Filter: A Versatile Signal Processing Building Block", Jan. 1988, Proceedings of the IEEE, vol. 76, No. 1, pp. 19-37. (Year: 1988).*

(Continued)

*Primary Examiner* — Daniel R Sellers
(74) *Attorney, Agent, or Firm* — Winston Hsu

(57) ABSTRACT

A leveling equalizer includes a graphic equalizer circuit, a first multiplication circuit, a second multiplication circuit, an addition circuit, and a gain control circuit. The graphic equalizer circuit processes a first input signal and output a first output signal and a second output signal. The first multiplication circuit multiplies the first output signal and one of an adjustable gain value and a fixed gain value to generate a first adjusted output signal. The second multiplication circuit multiplies the second output signal and another of the adjustable gain value and the fixed gain value to generate a second adjusted output signal. The addition circuit combines the first adjusted output signal and the second adjusted output signal to generate an equalizer output signal. The gain control circuit dynamically adjusts the adjustable gain value according to the equalizer output signal.

16 Claims, 5 Drawing Sheets

(56) References Cited

U.S. PATENT DOCUMENTS

| | | | |
|---|---|---|---|
| 7,092,537 B1* | 8/2006 | Allred | H04R 3/04 |
| | | | 381/103 |
| 2004/0178852 A1* | 9/2004 | Neunaber | H03G 11/04 |
| | | | 330/284 |
| 2006/0274903 A1* | 12/2006 | Aoki | H04R 3/00 |
| | | | 381/56 |
| 2007/0291959 A1* | 12/2007 | Seefeldt | H03G 3/3005 |
| | | | 381/104 |
| 2008/0133631 A1 | 6/2008 | Chen | |
| 2011/0184540 A1* | 7/2011 | Huang | H03G 3/301 |
| | | | 700/94 |

OTHER PUBLICATIONS

"Equalizer", http://www.donreiman.com/Equalizer/Equalizer.htm, Jul. 15, 2018.

* cited by examiner

METHOD FOR DYNAMICALLY ADJUSTING ADJUSTABLE GAIN VALUE TO EQUALIZE INPUT SIGNAL TO GENERATE EQUALIZER OUTPUT SIGNAL AND ASSOCIATED LEVELING EQUALIZER

BACKGROUND OF THE INVENTION

1. Field of the Invention

The present invention relates to an equalizer design, and more particularly, to a method for dynamically adjusting an adjustable gain value to equalize an input signal to generate an equalizer output signal and associated leveling equalizer.

2. Description of the Prior Art

As the volume of playback device (e.g. loudspeaker or earphone) gradually decreases, the human hearing will become less and less sensitive to low frequency band (e.g. below 1 kHz) or high frequency band (e.g. above 7 kHz). As a result, when users listen to music at a low volume through the playback device in the middle of the night, the users will not be able to clearly distinguish sound components of the low and high frequencies, which will reduce listening quality. In order to allow the users to listen to music at various volume levels under the situation that they can feel a flat frequency response, an optimized leveling equalizer is urgently needed, which may adjust the gain according to the volume in the low frequency band or high frequency band, and has the flat frequency response.

SUMMARY OF THE INVENTION

It is therefore an objective of the present invention to provide a method for dynamically adjusting an adjustable gain value to equalize an input signal to generate an equalizer output signal and associated leveling equalizer, in order to solve the above-mentioned problems.

According to an embodiment of the present invention, a leveling equalizer is provided. The leveling equalizer may include a graphic equalizer circuit, a first multiplication circuit, a second multiplication circuit, an addition circuit, and a gain control circuit. The graphic equalizer circuit may be arranged to process a first input signal and output a first output signal and a second output signal. The first multiplication circuit may be coupled to the graphic equalizer circuit, and may be arranged to multiply the first output signal and one of an adjustable gain value and a fixed gain value to generate a first adjusted output signal. The second multiplication circuit may be coupled to the graphic equalizer circuit, and may be arranged to multiply the second output signal and another of the adjustable gain value and the fixed gain value to generate a second adjusted output signal. The addition circuit may be coupled to the first multiplication circuit and the second multiplication circuit, and may be arranged to combine the first adjusted output signal and the second adjusted output signal to generate an equalizer output signal. The gain control circuit may be coupled to the addition circuit and one of the first multiplication circuit and the second multiplication circuit, and may be arranged to dynamically adjust the adjustable gain value according to the equalizer output signal.

According to an embodiment of the present invention, a method for dynamically adjusting an adjustable gain value to equalize an input signal to generate an equalizer output signal is provided. The method may include: performing graphic equalization upon the first input signal to generate and output a first output signal and a second output signal; multiplying the first output signal and one of an adjustable gain value and a fixed gain value to generate a first adjusted output signal; multiplying the second output signal and another of the adjustable gain value and the fixed gain value to generate a second adjusted output signal; combining the first adjusted output signal and the second adjusted output signal to generate the equalizer output signal; and dynamically adjusting the adjustable gain value according to the equalizer output signal.

As the volume of the playback device (e.g. the loudspeaker or the earphone) gradually decreases, the human hearing will become less and less sensitive to the frequency band below 1 kHz or above 7 kHz. However, the leveling equalizer of the present invention can be used to compensate the hearing characteristics of both ends (i.e. the frequency band below 1 kHz or above 7 kHz), to improve the above-mentioned problem. As a result, even if the human ear receives a small volume, it can hear a flat frequency response and clearly hear the low and high frequency sound components by the leveling equalizer of the present invention.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
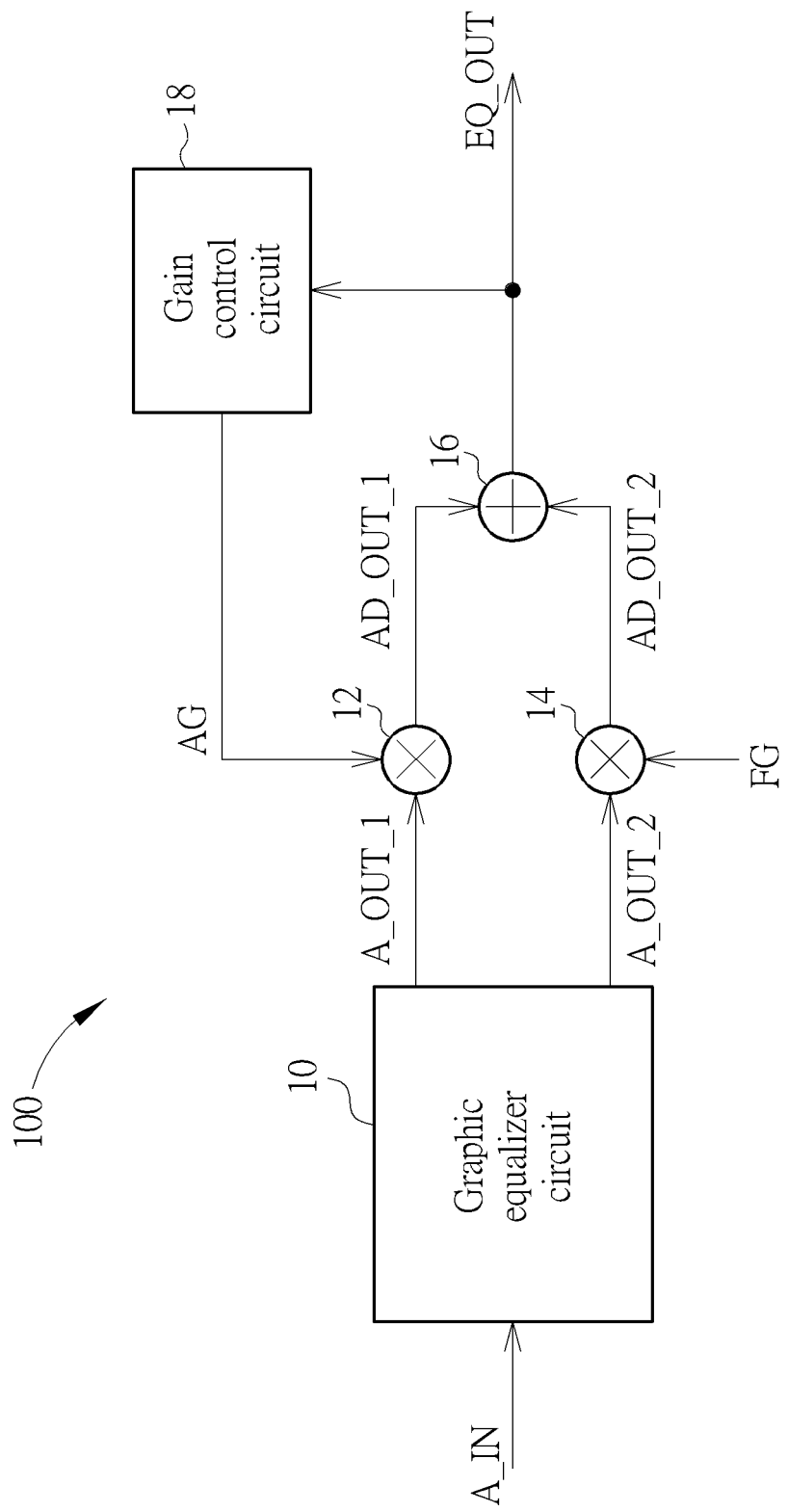
FIG. 1 is a diagram illustrating a leveling equalizer according to an embodiment of the present invention.

FIG. 1 is a diagram illustrating a leveling equalizer 100 according to an embodiment of the present invention. The leveling equalizer 100 may include a graphic equalizer circuit 10, a plurality of multiplication circuits 12 and 14, an addition circuit 16, and a gain control circuit 18. The graphic equalizer circuit 10 may be arranged to process a first input signal A_IN in a graphic equalization manner that separates the frequency band of the first input signal A_IN into 2 frequency bands (i.e. a high frequency band and a low frequency band) for individual frequency response compensation, and output a first output signal A_OUT_1 and a second output signal A_OUT_2, wherein the frequency bands of the first output signal A_OUT_1 and the second output signal A_OUT_2 are the low frequency band and the high frequency band, respectively.

The multiplication circuit 12 may be coupled to the graphic equalizer circuit 10, and may be arranged to multiply the first output signal A_OUT_1 and one of an adjustable gain value AG and a fixed gain value FG to generate a first adjusted output signal AD_OUT_1. The multiplication circuit 14 may be coupled to the graphic equalizer circuit 10, and may be arranged to multiply the second output signal A_OUT_2 and another of the adjustable gain value AG and the fixed gain value FG to generate a second adjusted output signal AD_OUT_2. For example, the fixed gain value FG is equal to 1 (i.e. if the second output signal A_OUT_2 is multiplied by the fixed gain value FG, the gain value of the second output signal A_OUT_2 remains unchanged). In this embodiment, the leveling equalizer 100 is shown having the adjustable gain value AG applied to the multiplication circuit 12 and the fixed gain value FG applied to the multiplication circuit 14. The gain value of the second output signal A_OUT_2 is equal to the gain value of the second adjusted output signal AD_OUT_2 due to the fixed gain value FG. The gain values of the first output signal A_OUT_1 and the first adjusted output signal AD_OUT_1 are not necessarily the same due to the adjustable gain value AG.

The addition circuit 16 may be coupled to the multiplication circuit 12 and the multiplication circuit 14, and may be arranged to combine the first adjusted output signal AD_OUT_1 and the second adjusted output signal AD_OUT_2 to generate an equalizer output signal EQ_OUT (i.e. EQ_OUT=AD_OUT_1+AD_OUT_2). The gain control circuit 18 may be coupled to the addition circuit 16 and one of the multiplication circuit 12 and the multiplication circuit 14, and may be arranged to dynamically adjust the adjustable gain value AG according to the equalizer output signal EQ_OUT. In this embodiment, the leveling equalizer 100 is shown having the gain control circuit 18 coupled to the addition circuit 16 and the multiplication circuit 12.

For brevity and simplicity, the following assumes that the first output signal A_OUT_1 is multiplied by the adjustable gain value AG, the second output signal A_OUT_2 is multiplied by the fixed gain value FG, and the gain control circuit 18 is coupled to the addition circuit 16 and the multiplication circuit 12. However, this is for illustrative purposes only, and is not meant to be a limitation of the present invention. In some embodiments, the leveling equalizer 100 may be modified to have the first output signal A_OUT_1 multiplied by the fixed gain value FG, the second output signal A_OUT_2 multiplied by the adjustable gain value AG, and the gain control circuit 18 coupled to the addition circuit 16 and the multiplication circuit 14, where frequency bands of the first output signal A_OUT_1 and the second output signal A_OUT_2 are the low frequency band and the high frequency band, respectively.

Figure 2:
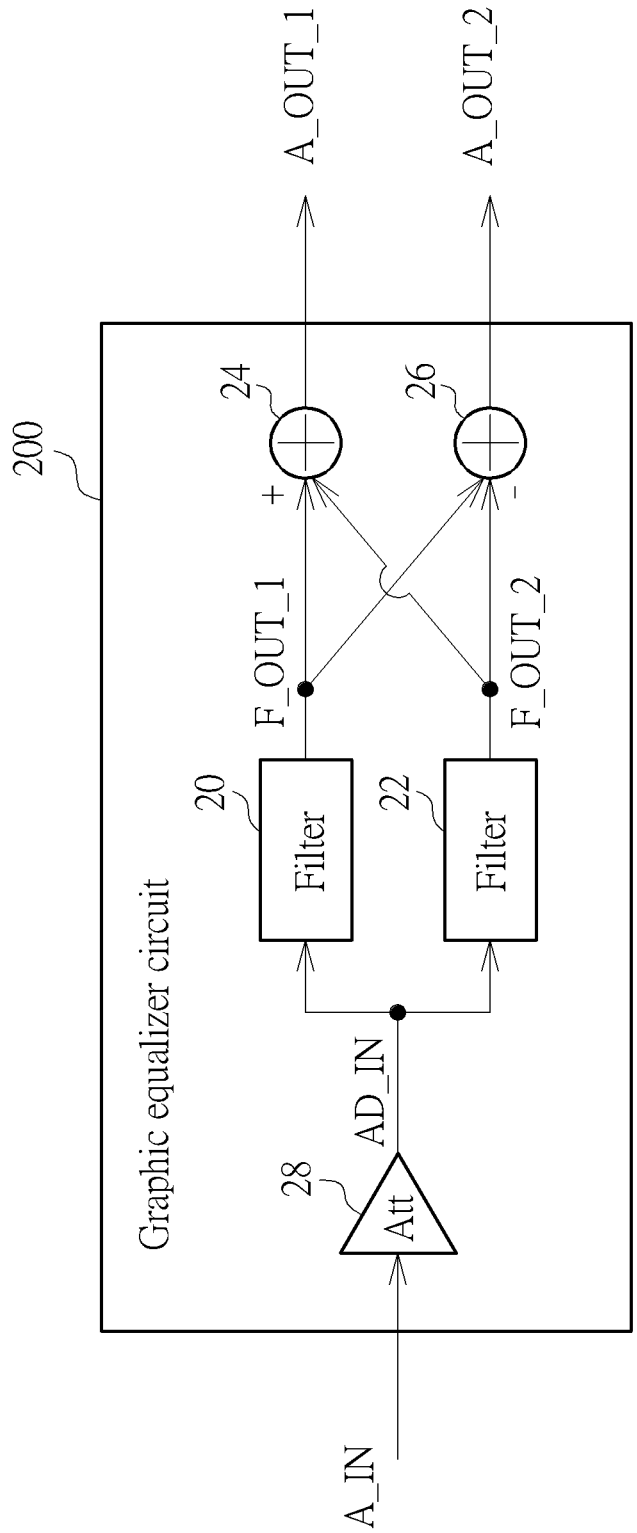
FIG. 2 is a diagram illustrating a graphic equalizer circuit according to an embodiment of the present invention.

FIG. 2 is a diagram illustrating a graphic equalizer circuit 200 according to an embodiment of the present invention. The graphic equalizer circuit 10 in the leveling equalizer 100 shown in FIG. 1 may be implemented using the graphic equalizer circuit 200 shown in FIG. 2. As shown in FIG. 2, the graphic equalizer circuit 200 may include a plurality of filters 20 and 22, an addition circuit 24, a subtraction circuit 26, and an attenuator circuit 28. The filter 20 may be arranged to generate a first filtered signal F_OUT_1 according to a second input signal AD_IN derived from the first input signal A_IN. The filter 22 may be arranged to generate a second filtered signal F_OUT_2 according to the second input signal AD_IN. The addition circuit 24 may be coupled to the filters 20 and 22, and may be arranged to combine the first filtered signal F_OUT_1 and the second filtered signal F_OUT_2, wherein the first output signal A_OUT_1 is derived from an output of the addition circuit 24, and the first output signal A_OUT_1 is a low pass filtered signal. The subtraction circuit 26 may be coupled to the filters 20 and 22, and may be arranged to subtract the second filtered signal F_OUT_2 from the first filtered signal F_OUT_1, wherein the second output signal A_OUT_2 is derived from an output of the subtraction circuit 26, and the second output signal A_OUT_2 is a high pass filtered signal. The attenuator circuit 28 may be coupled to the filters 20 and 22, and may be arranged to attenuate the first input signal A_IN (e.g. attenuate the first input signal A_IN by half) to generate the second input signal AD_IN. That is, AD_IN=(½)*A_IN.

In this embodiment, the filters 20 and 22 can be all pass filters, linkwitz filters, or other filters that can divide the frequency. In addition, the first input signal A_IN is separated into a low pass filtered signal (i.e. the first output signal A_OUT_1) and a high pass filtered signal (i.e. the second output signal A_OUT_2). For example, the low pass filtered signal is obtained by combining the first filtered signal F_OUT_1 and the second filtered signal F_OUT_2 through the addition circuit 24, and dividing by 2 through the attenuator circuit 28 (i.e.

$$A\_OUT\_1 = \frac{F\_OUT\_1 + F\_OUT\_2}{2}),$$

and the high pass filtered signal is obtained by subtracting the second filtered signal F_OUT_2 from the first filtered signal F_OUT_1 through the subtraction circuit 26, and dividing by 2 through the attenuator circuit 28 (i.e.

$$A\_OUT\_2 = \frac{F\_OUT\_1 - F\_OUT\_2}{2}),$$

but the present invention is not limited thereto. For example, in some embodiments, the attenuator circuit 28 may be replaced with two attenuator circuits that are coupled after the addition circuit 24 and the subtraction circuit 26, respectively, wherein the second input signal AD_IN is the same as the first input signal A_IN, and the equalization result (A_OUT_1 and A_OUT_2) generated from a modified graphic equalizer circuit that couples two attenuator circuits after the addition circuit 24 and the subtraction circuit 26 is substantially the same as that generated from the original graphic equalizer circuit 200 that couples the single attenuator circuit 28 before the filters 20 and 22. These alternative designs all fall within the scope of the present invention.

Figure 3:
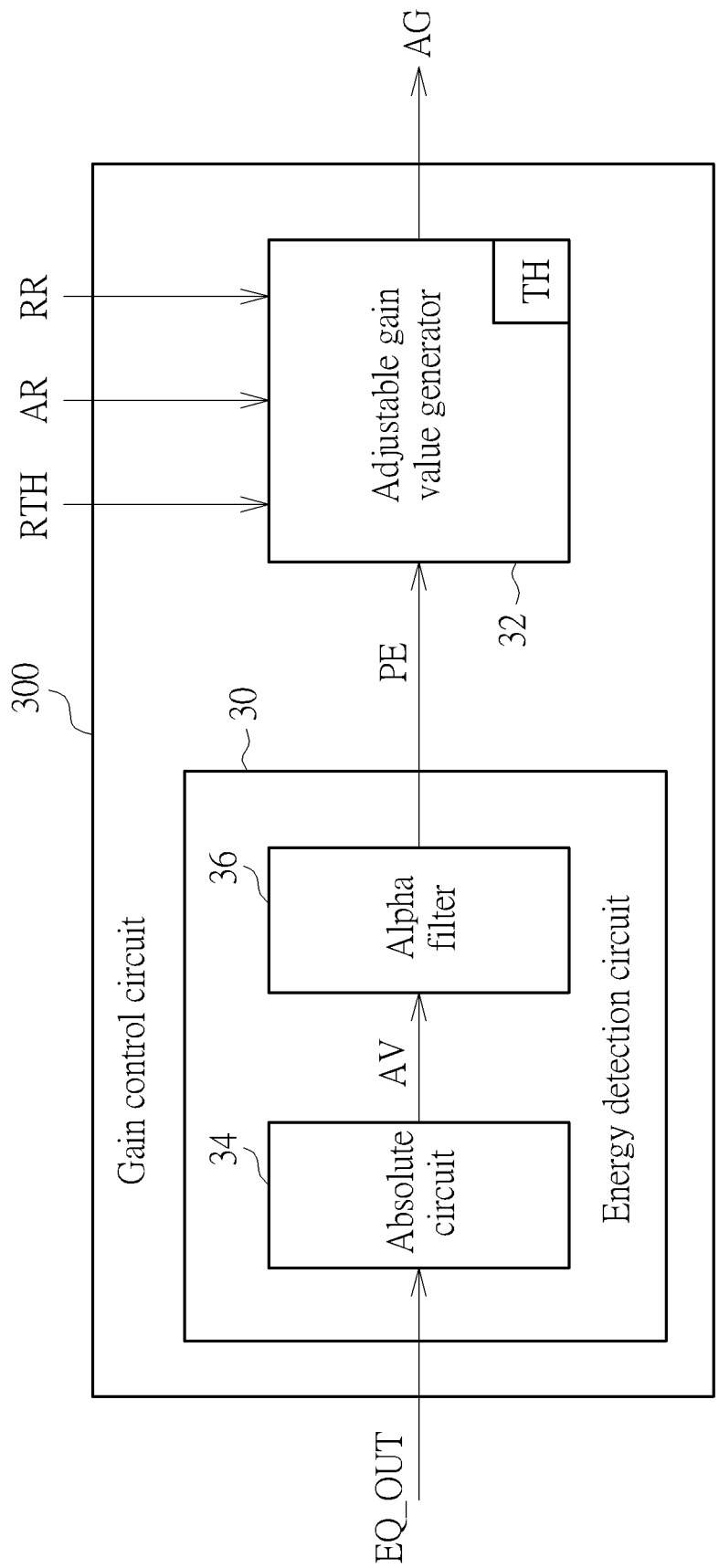
FIG. 3 is a diagram illustrating a gain control circuit according to an embodiment of the present invention.

FIG. 3 is a diagram illustrating a gain control circuit 300 according to an embodiment of the present invention. The gain control circuit 18 in the leveling equalizer 100 shown in FIG. 1 may be implemented using the gain control circuit 300 shown in FIG. 3. As shown in FIG. 3, the gain control circuit 300 may include an energy detection circuit 30 and an adjustable gain value generator 32. The energy detection circuit 30 may be arranged to measure a peak energy PE of the equalizer output signal EQ_OUT. The adjustable gain value generator 32 may be coupled to the energy detection circuit 30, and may be arranged to dynamically adjust the adjustable gain value AG according to the peak energy PE of the equalizer output signal EQ_OUT. In this embodiment, the energy detection circuit 30 may include an absolute circuit 34 and an alpha filter 36. The absolute circuit 34 may be arranged to generate an absolute value AV of the equalizer output signal EQ_OUT by performing absolute value computation upon the equalizer output signal EQ_OUT. The alpha filter 36 may be coupled to the absolute circuit 34 and the adjustable gain value generator 32, and may be arranged to generate the peak energy PE according to the absolute value computation result (i.e. absolute value AV) and transmit the peak energy PE to the adjustable gain value generator 32. For example, the alpha filter 36 can be a $2^{nd}$ order alpha filter, and the coefficients of the $2^{nd}$ order alpha filter are 2's power (i.e. $\frac{1}{128}$, $\frac{1}{256}$, $\frac{1}{512}$, . . . etc.), but the present invention is not limited thereto.

For directly controlling the adjustable gain value AG with slope adjustment to dynamically adjust the adjustable gain value AG according to the peak energy PE of the equalizer output signal EQ_OUT, an attack control and a release control are adopted in the adjustable gain value generator 32, wherein the release control may be arranged to release the equalizer output signal EQ_OUT when the peak energy PE is smaller than a threshold value TH, and the attack control may be arranged to suppress the equalizer output signal EQ_OUT when the peak energy PE is not smaller than the threshold value TH. Therefore, the adjustable gain value generator 32 may be further arranged to receive a reference threshold value RTH, an attack rate setting AR and a release rate setting RR. The threshold value TH internally used by the adjustable gain value generator 32 is obtained by multiplying the reference threshold RTH and a pre-determined coefficient (e.g. TH=RTH*0.635, where 0.635 is the pre-determined coefficient). The attack rate setting AR may be larger than the release rate setting RR. After receiving the peak energy PE from the alpha filter 36, the adjustable gain value generator 32 may compare the peak energy PE with the threshold value TH. If the peak energy PE is smaller than the threshold value TH (i.e. in a range of the release control), the adjustable gain value generator 32 may control the adjustable gain value AG according to slope adjustment specified by the release rate setting RR; and if the peak energy PE is not smaller than the threshold value TH (i.e. in a range of the attack control), the adjustable gain value generator 32 may control the adjustable gain value AG according to slope adjustment specified by the attack rate setting AR.

It should be noted that the gain control circuit 300 is only one exemplary implementation of the gain control circuit 18 in the leveling equalizer 100. In practice, any circuit architecture that is capable of dynamically adjusting the adjustable gain value AG according to the equalizer output signal EQ_OUT may be employed by the gain control circuit 18. These alternative designs all fall within the scope of the present invention.

Figure 4:
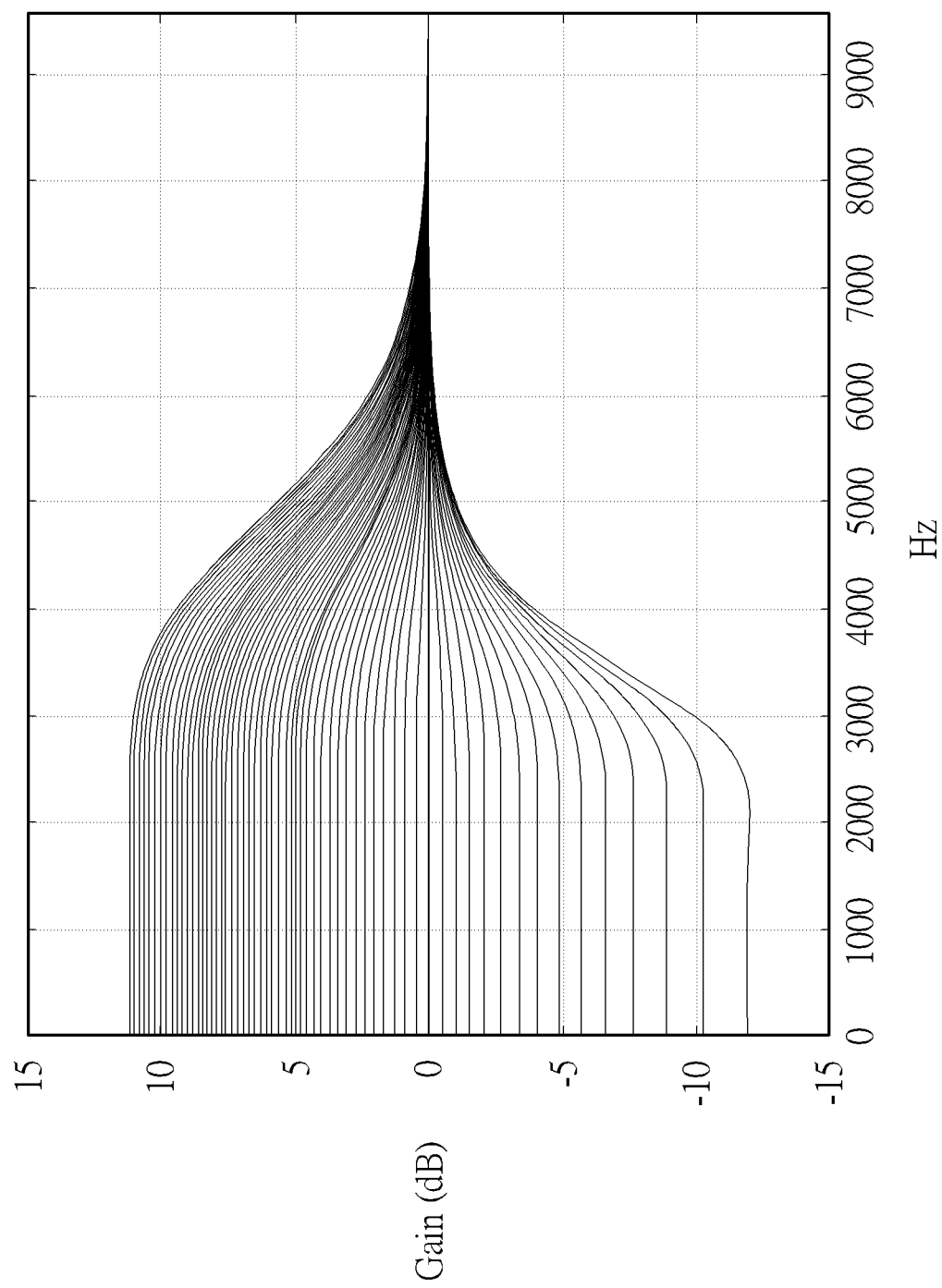
FIG. 4 is a diagram illustrating the leveling equalizer shown in FIG. 1 with different gain values set under different adjustable gain values according to an embodiment of the present invention.

FIG. 4 is a diagram illustrating the leveling equalizer 100 shown in FIG. 1 with different gain values set under different adjustable gain values AG according to an embodiment of the present invention. Suppose that the graphic equalizer circuit 10 in the leveling equalizer 100 shown in FIG. 1 is implemented using the graphic equalizer circuit 200 shown in FIG. 2. The filter 20 and the filter 22 are configured as a $1^{st}$ order all pass filter and a $2^{nd}$ order all pass filter, respectively. In addition, the first output signal A_OUT_1 (e.g. a low pass filtered signal) is multiplied by the adjustable gain value AG (i.e. the gain value of the first output signal A_OUT_1 is dynamically adjusted by the adjustable gain value AG), and the second output signal A_OUT_2 (e.g. a high pass filtered signal) is multiplied by the fixed gain value FG (i.e. the gain value of the second output signal A_OUT_2 is fixed to 1).

As shown in FIG. 4, 64 frequency response curves are obtained by directly controlling the adjustable gain value AG with slope adjustment. The number of the frequency response curves can be determined based on the accuracy. In this embodiment, 64 frequency response curves are for illustrative purposes only, and are not meant to be a limitation of the present invention. The gain control range of the present invention is basically unlimited, that is, the gain control range of the gain value of the first output signal A_OUT_1 will not be restricted by the choice of the plurality of filters 20 and 22.

In this embodiment, all response curves are smooth in FIG. 4, which cause less signal variation and less power variation when the leveling equalizer 100 is used. In addition, the leveling equalizer 100 of the present invention covers a wide range of frequencies (the range of the frequencies is approximately from 0 Hz to 8000 Hz). Since the human hearing will become less and less sensitive to the frequency band below 1 kHz or above 7 kHz when the volume of the playback device (e.g. the loudspeaker or the earphone) gradually decreases, the leveling equalizer 100 of the present invention can be used to compensate the hearing characteristics of both ends (i.e. the frequency band below 1 kHz or above 7 kHz). As a result, even if the human ear receives a small volume, it can hear a flat frequency response and clearly hear the low and high frequency sound components by the leveling equalizer 100 of the present invention. However, when the first input signal A_IN is an out-of-band signal of the leveling equalizer 100 (e.g. the frequency of the first input signal A_IN is 9000 Hz), the equalizer output signal EQ_OUT is identical to the first input signal A_IN (i.e. the leveling equalizer 100 of the present invention will not dynamically adjust the adjustable gain value AG to equalize the first input signal A_IN).

Figure 5:
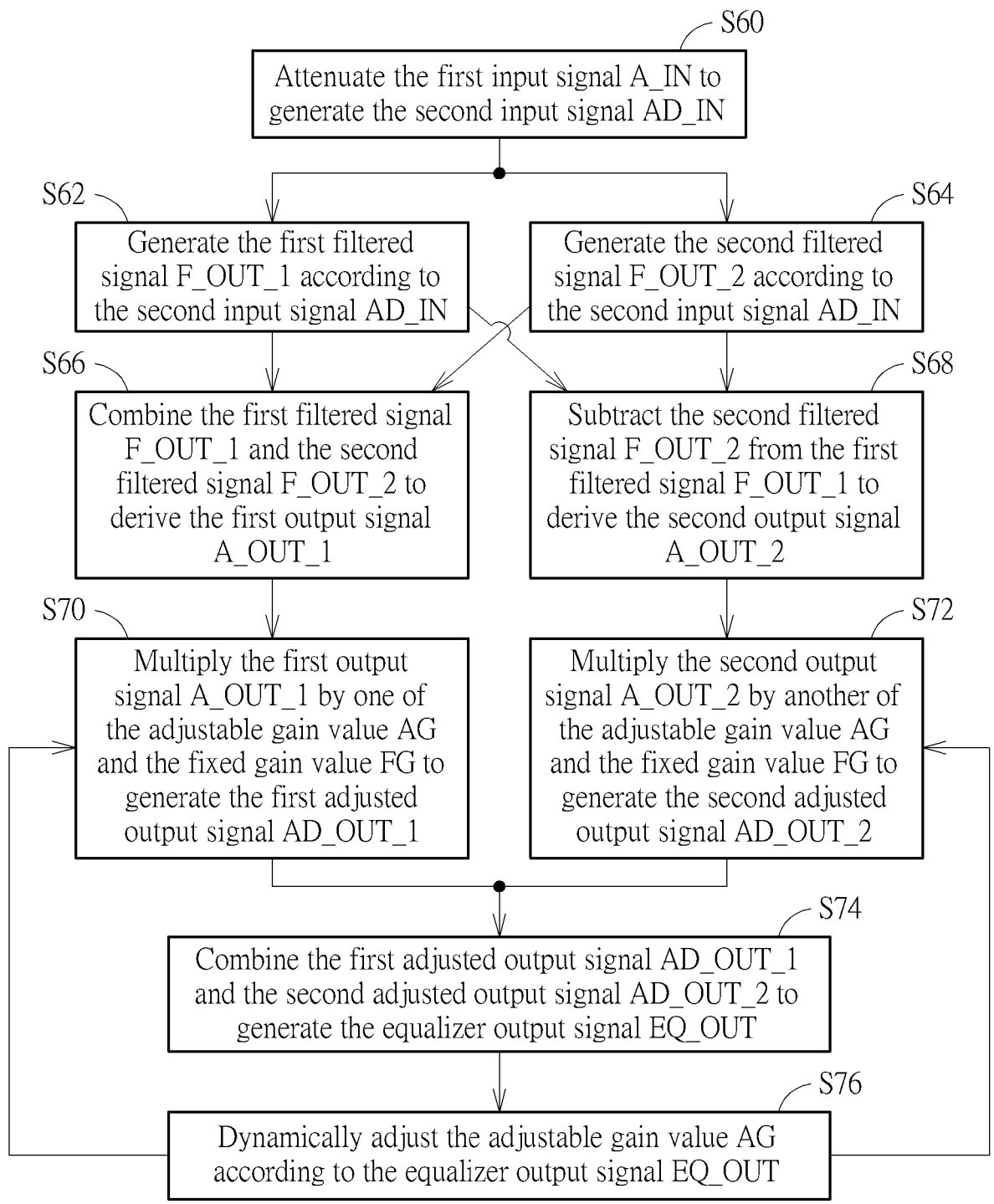
FIG. 5 is a flow chart illustrating a method for dynamically adjusting an adjustable gain value to equalize an input signal according to an embodiment of the present invention.

FIG. 5 is a flow chart illustrating a method for dynamically adjusting an adjustable gain value AG to equalize an input signal according to an embodiment of the present invention. Provided that the result is substantially the same, the steps are not required to be executed in the exact order shown in FIG. 5. For example, the method shown in FIG. 5 may be employed by the leveling equalizer 100 shown in FIG. 1.

In Step S60, the first input signal A_IN is attenuated to generate the second input signal AD_IN.

In Step S62, the first filtered signal F_OUT_1 is generated according to the second input signal AD_IN.

In Step S64, the second filtered signal F_OUT_2 is generated according to the second input signal AD_IN.

In Step S66, the first filtered signal F_OUT_1 and the second filtered signal F_OUT_2 are combined to derive the first output signal A_OUT_1.

In Step S68, the second filtered signal F_OUT_2 is subtracted from the first filtered signal F_OUT_1 to derive the second output signal A_OUT_2.

In Step S70, the first output signal A_OUT_1 is multiplied by one of the adjustable gain value AG and the fixed gain value FG to generate the first adjusted output signal AD_OUT_1.

In Step S72, the second output signal A_OUT_2 is multiplied by another of the adjustable gain value AG and the fixed gain value FG to generate the second adjusted output signal AD_OUT_2.

In Step S74, the first adjusted output signal AD_OUT_1 and the second adjusted output signal AD_OUT_2 are combined to generate the equalizer output signal EQ_OUT.

In Step S76, the adjustable gain value AG is dynamically adjusted according to the equalizer output signal EQ_OUT.

Since a person skilled in the pertinent art can readily understand details of the steps after reading above paragraphs directed to the leveling equalizer 100 shown in FIG. 1, further description is omitted here for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A leveling equalizer, comprising:
a graphic equalizer circuit, arranged to process a first input signal and output a first output signal and a second output signal;
a first multiplication circuit, coupled to the graphic equalizer circuit, and arranged to multiply the first output signal and one of an adjustable gain value and a fixed gain value to generate a first adjusted output signal;
a second multiplication circuit, coupled to the graphic equalizer circuit, and arranged to multiply the second output signal and another of the adjustable gain value and the fixed gain value to generate a second adjusted output signal;
an addition circuit, coupled to the first multiplication circuit and the second multiplication circuit, and arranged to combine the first adjusted output signal and the second adjusted output signal to generate an equalizer output signal; and
a gain control circuit, coupled to the addition circuit and one of the first multiplication circuit and the second multiplication circuit, and arranged to dynamically adjust the adjustable gain value according to the equalizer output signal;
wherein the gain control circuit comprises:
an energy detection circuit, arranged to measure a peak energy of the equalizer output signal; and
an adjustable gain value generator, coupled to the energy detection circuit, and arranged to dynamically adjust the adjustable gain value according to the peak energy of the equalizer output signal;
wherein the energy detection circuit comprises:
an absolute circuit, arranged to generate an absolute value of the equalizer output signal; and
an alpha filter, coupled to the absolute circuit and the adjustable gain value generator, and arranged to generate the peak energy according to an output of the absolute circuit, wherein the alpha filter is a $2^{nd}$ order alpha filter, and coefficients of the $2^{nd}$ order alpha filter are 2's power.

2. The leveling equalizer of claim 1, wherein the fixed gain value is equal to 1.

3. The leveling equalizer of claim 1, wherein the graphic equalizer circuit comprises:
a first filter, arranged to generate a first filtered signal according to a second input signal derived from the first input signal;
a second filter, arranged to generate a second filtered signal according to the second input signal;
an addition circuit, coupled to the first filter and the second filter, and arranged to combine the first filtered signal and the second filtered signal, wherein the first output signal is derived from an output of the addition circuit; and
a subtraction circuit, coupled to the first filter and the second filter, and arranged to subtract the second filtered signal from the first filtered signal, wherein the second output signal is derived from an output of the subtraction circuit.

4. The leveling equalizer of claim 3, wherein the graphic equalizer circuit further comprises:

an attenuator circuit, coupled to the first filter and the second filter, and arranged to attenuate the first input signal to generate the second input signal.

5. The leveling equalizer of claim 3, wherein the first output signal is a low pass filtered signal, and the second output signal is a high pass filtered signal.

6. The leveling equalizer of claim 1, wherein the adjustable gain value generator is further arranged to receive an attack rate setting and a release rate setting; when the peak energy of the equalizer output signal is smaller than a threshold value, the adjustable gain value generator controls the adjustable gain value according to slope adjustment specified by the release rate setting; and when the peak energy of the equalizer output signal is not smaller than the threshold value, the adjustable gain value generator controls the adjustable gain value according to slope adjustment specified by the attack rate setting.

7. The leveling equalizer of claim 6, wherein the adjustable gain value generator is further arranged to receive a reference threshold value, and obtains the threshold value by multiplying the reference threshold and a pre-determined coefficient.

8. The leveling equalizer of claim 1, wherein when the first input signal is an out-of-band signal of the leveling equalizer, the equalizer output signal is identical to the first input signal.

9. A method for equalizing a first input signal to generate an equalizer output signal, comprising:
performing graphic equalization upon the first input signal to generate and output a first output signal and a second output signal;
multiplying the first output signal and one of an adjustable gain value and a fixed gain value to generate a first adjusted output signal;
multiplying the second output signal and another of the adjustable gain value and the fixed gain value to generate a second adjusted output signal;
combining the first adjusted output signal and the second adjusted output signal to generate the equalizer output signal; and
dynamically adjusting the adjustable gain value according to the equalizer output signal;
wherein dynamically adjusting the adjustable gain value according to the equalizer output signal comprises:
measuring a peak energy of the equalizer output signal; and
dynamically adjusting the adjustable gain value according to the peak energy of the equalizer output signal;
wherein measuring the peak energy of the equalizer output signal comprises:
performing absolute value computation upon the equalizer output signal to generate an absolute value computation result; and
generating the peak energy according to the absolute value computation result through an alpha filter, wherein the alpha filter is a $2^{nd}$ order alpha filter, and coefficients of the $2^{nd}$ order alpha filter are 2's power.

10. The method of claim 9, wherein the fixed gain value is equal to 1.

11. The method of claim 9, wherein processing the first input signal to generate and output the first output signal and the second output signal comprises:
generating a first filtered signal according to a second input signal derived from the first input signal;
generating a second filtered signal according to the second input signal;

combining the first filtered signal and the second filtered signal to derive the first output signal; and subtracting the second filtered signal from the first filtered signal to derive the second output signal.

12. The method of claim 11, wherein processing the first input signal to generate and output the first output signal and the second output signal further comprises:

attenuating the first input signal to generate the second input signal.

13. The method of claim 11, wherein the first output signal is a low pass filtered signal, and the second output signal is a high pass filtered signal.

14. The method of claim 9, wherein dynamically adjusting the adjustable gain value according to the peak energy of the equalizer output signal comprises:

receiving an attack rate setting and a release rate setting;

when the peak energy of the equalizer output signal is smaller than a threshold value, controlling the adjustable gain value according to slope adjustment specified by the release rate setting; and when the peak energy of the equalizer output signal is not smaller than the threshold value, controlling the adjustable gain value according to slope adjustment specified by the attack rate setting.

15. The method of claim 14, wherein dynamically adjusting adjustable gain value according to the peak energy of the equalizer output signal further comprises:

receiving a reference threshold value; and obtaining the threshold value by multiplying the reference threshold and a pre-determined coefficient.

16. The method of claim 9, wherein in response to the first input signal being an out-of-band signal, the method generates the equalizer output signal that is identical to the first input signal.

* * * * *